United States Patent
Eisele et al.

(10) Patent No.: US 10,832,995 B2
(45) Date of Patent: Nov. 10, 2020

(54) POWER MODULE

(71) Applicant: Danfoss Silicon Power GmbH, Flensburg (DE)

(72) Inventors: Ronald Eisele, Surendorf (DE); Frank Osterwald, Kiel (DE)

(73) Assignee: Danfoss Silicon Power GmbH, Flensburg (DE)

(*) Notice: Subject to any disclaimer, the term of this patent is extended or adjusted under 35 U.S.C. 154(b) by 0 days.

(21) Appl. No.: 16/513,919

(22) Filed: Jul. 17, 2019

(65) Prior Publication Data

US 2019/0341341 A1 Nov. 7, 2019

Related U.S. Application Data

(62) Division of application No. 15/544,689, filed as application No. PCT/EP2016/051875 on Jan. 29, 2016, now Pat. No. 10,403,566.

(30) Foreign Application Priority Data

Feb. 12, 2015 (DE) .................... 10 2015 102 041

(51) Int. Cl.
  *H01L 21/56* (2006.01)
  *H01L 23/495* (2006.01)
  *H01L 23/29* (2006.01)
  *H01L 23/433* (2006.01)
  *H01L 23/31* (2006.01)

(52) U.S. Cl.
  CPC ...... *H01L 23/49562* (2013.01); *H01L 23/291* (2013.01); *H01L 23/4334* (2013.01); *H01L 21/565* (2013.01); *H01L 23/3121* (2013.01); *H01L 2224/32245* (2013.01); *H01L 2224/8384* (2013.01); *H01L 2224/83801* (2013.01)

(58) Field of Classification Search
  CPC ............. H01L 23/49562; H01L 23/291; H01L 23/4334; H01L 23/3121; H01L 21/565
  See application file for complete search history.

(56) References Cited

U.S. PATENT DOCUMENTS

| | | | | |
|---|---|---|---|---|
| 8,455,987 B1* | 6/2013 | Spann | ............... | H01L 23/49562 257/675 |
| 2004/0262720 A1* | 12/2004 | Satou | .................. | H01L 23/3142 257/676 |
| 2012/0313229 A1* | 12/2012 | Lee | ....................... | H01L 23/552 257/675 |
| 2014/0097529 A1* | 4/2014 | Cruz | ..................... | H01L 23/495 257/676 |
| 2014/0103510 A1* | 4/2014 | Andou | ..................... | H01L 24/36 257/676 |
| 2014/0131846 A1* | 5/2014 | Shiramizu | ........... | H01L 21/4825 257/669 |
| 2014/0374801 A1* | 12/2014 | Ikeda | ................. | H01L 23/49575 257/195 |

(Continued)

*Primary Examiner* — Nathan W Ha
(74) *Attorney, Agent, or Firm* — McCormick, Paulding & Huber PLLC

(57) ABSTRACT

A power module (10) having a leadframe (20), a power semiconductor (30) arranged on the leadframe (20), a base plate (40) for dispersing heat generated by the power semiconductor (30) and a potting compound (50) surrounding the leadframe (20) and the power semiconductor (30), that physically connects the power semiconductor (30) and/or the leadframe (20) to the base plate (40).

20 Claims, 1 Drawing Sheet

(56) References Cited

U.S. PATENT DOCUMENTS

| | | | |
|---|---|---|---|
| 2015/0221584 A1* | 8/2015 | Lopez | H01L 24/40 257/676 |
| 2015/0221621 A1* | 8/2015 | Mochida | H01L 23/36 361/709 |
| 2015/0262925 A1* | 9/2015 | Xue | H01L 24/49 257/675 |
| 2015/0270201 A1* | 9/2015 | Kim | H01L 24/40 257/676 |
| 2015/0270207 A1* | 9/2015 | Kim | H01L 24/37 257/676 |
| 2015/0348886 A1* | 12/2015 | Wood | H03F 3/195 257/76 |
| 2015/0357271 A1* | 12/2015 | Furumai | H01L 23/3677 257/692 |

* cited by examiner

POWER MODULE

CROSS-REFERENCE TO RELATED APPLICATIONS

This application is a divisional of U.S. patent application Ser. No. 15/544,689, filed Jul. 19, 2017, which is a National Stage application of International Patent Application No. PCT/EP2016/051875, filed on Jan. 29, 2016, which claims priority to German Patent Application No. DE 10 2015 102 041.6, filed on Feb. 12, 2015, each of which is hereby incorporated by reference in its entirety.

TECHNICAL FIELD

The invention relates to a power module having a leadframe, a power semiconductor arranged on the leadframe and a potting compound surrounding the leadframe and the power semiconductor.

BACKGROUND

Power semiconductors are conventionally surrounded by plastics, that is to say organic potting compounds, to protect them against environmental influences on the one hand and to insulate them electrically on the other hand. To this end, the plastics are partly enriched with fillers that are to fulfil certain functions—for example potting compounds are enriched with fillers for adjusting a specific thermal-expansion behaviour.

Despite the enrichment of the organic potting compounds with fillers having a good thermal conductivity, the increase in thermal conductivity that is achieved in the potting compound is disappointing.

For this reason, heat dissipation of the semiconductor is predominantly attempted via the so-called thermal stack, that is to say via a good thermally-conducting connection of the power conductor to a substrate and via its good thermal connection to a base plate or a heatsink.

The electric insulation capability of the thermal stack is ensured in some case via ceramic support layers in the substrate or in other cases via special electrically insulating organic heat-conducting films.

A disadvantage of this construction, and the procedure for manufacturing power modules constructed in this way, is now that on account of the great variety of the materials needed for this purpose, attention has to be paid to their different interactions among each other, e.g. chemical or also thermo-mechanical interactions. Since on account of these interactions it is often also necessary to carry out certain process steps separate from each other, or one after the other, this produces a high outlay in terms of work and also time.

SUMMARY

The object of the invention is therefore to provide a power module having a potting compound surrounding a power semiconductor, the module being of a simple construction and ensuring good heat dissipation of the semiconductors. A further object of the invention is to provide a simple and time-saving method for producing such a power module.

These objects are achieved according to the invention by the power module having a leadframe, a power semiconductor arranged on the leadframe, a floor plate for dispersing heat generated by the power semiconductor, and a potting compound which surrounds the leadframe and the power semiconductor, and which connects the power semiconductor and/or the leadframe to the floor plate, and a method for manufacturing a power module having the following steps: connecting the power semiconductor to the leadframe followed by potting the power semiconductor connected to the leadframe with a potting compound while at the same time physically connecting the base plate to the potting compound.

The potting compound acts not only as a means of encapsulation; sealing the semiconductor from the outside environment, but also as an adhesive; fixing in a permanent manner the structure comprising the semiconductor and leadframe to the baseplate.

The basic idea of the invention is to accomplish the potting of power semiconductors and the connection to a heatsink by one and the same material that can be processed in a single procedure.

The potting compound used may be an inorganic compound. The inorganic potting compound may exhibit in particular an aqueous binding mechanism as is, for example, known for cement. As potting compounds, cements, in particular derivatives of dental cements used in dental technology, can be considered.

By cement is meant an inorganic solid which results from the mixing of one or more powders with one or more liquids. Such compounds are well known from the construction industry and from dentistry where one example is a cement which uses a basic metal oxide powder mixed with and acidic liquid. An acid/base reaction occurs when mixed, forming a metal salt which acts as a binding matrix. Other formulations are also known. The resulting solid is often stable under a range of environmental changes (such as pressure, temperature, humidity or chemical) and adheres to a variety of other materials. It is therefore suitable for physically connecting those materials in a permanent manner.

The potting compound, e.g. cement, can be enriched with corresponding electrically insulating, heat-conducting fillers, so that the potting compound fulfils the function of potting, heat dissipation and physical connection of a power semiconductor applied to a leadframe and the base plate.

The physical-chemical properties of cements in particular make possible the purposes mentioned above.

The thermal coefficient of expansion can thus be adjusted in the order of magnitude of 5 to 10 ppm/K.

The electric insulation capacity of cement may be an important parameter in particular applications, such as that of high voltage semiconductors, for example those operating at or above 600 V. It may be an advantage if the electric insulation capacity of the cement is of the same order of magnitude as that of ceramic insulation plates, such as the plates used in the commonly used Direct Bonded Copper (DBC) construction comprising ceramic plates of, for example, aluminium oxide ($Al_2O_3$), Aluminium nitride (AlN) or silicon nitride ($Si_3N_4$). In practice, current cements may have an electric insulation capacity of an order of magnitude lower that such ceramic plates, The thermal conductivity of cement is absolutely sufficient in the case of layer thicknesses of 20 to 200 μm to bring a leadframe and a base plate into sufficient thermal contact.

The base plate for dissipating heat that has been given off by the power semiconductor can be arranged to have a high thermal capacity and/or can contribute to heat spreading. Here the base plate can be made of a metal, e.g. copper (Cu) or aluminium (Al), or a so-called metal-matrix material, in particular aluminium silicon carbide (AlSiC).

Over and above this, the manufacture of the potting and of the insulation of power modules having a leadframe, a power semiconductor arranged on the leadframe and a base plate for dispersing heat generated by the power semiconductor can take place in one step, so that an inorganic potting compound fulfils equally both a protective and also a heat-connecting function.

According to the invention, a power module having a leadframe, a power semiconductor arranged on the leadframe, a base plate for dispersing heat generated by the power semiconductor and a potting compound surrounding the leadframe and the power semiconductor, that connects physically the power semiconductor and/or the leadframe to the base plate, can thus be provided.

The potting compound is preferably an inorganic compound, in particular cement.

In general, the potting compound preferably exhibits a thermal coefficient of expansion of 5 to 10 ppm/K.

The construction of the power module is in particular such that the potting compound exhibits a layer arranged between the leadframe and the base plate. In this case, this layer arranged between the leadframe and the base plate preferably exhibits a thickness of 20 to 200 μm.

The base plate, however, is preferably designed as a heatsink, for example as a component which interfaces with an air or water cooler. Heat generated in the power semiconductor is transferred via the leadframe to the potting compound and then to the base plate and thus to the cooler.

A method designed according to the invention, for manufacturing a power module having a leadframe, a power semiconductor, and a base plate, exhibits the following steps: connecting the power semiconductor to the leadframe, and thereafter potting the power semiconductor connected to the leadframe with a potting compound while at the same time physically connecting the base plate to the potting compound. The connection of the power semiconductor to the leadframe may be achieved by a number of known techniques. These may include soldering, brazing or sintering.

Here the leadframe and the base plate are arranged relative to each other such that a layer of potting compound having a layer thickness of preferably 20 to 200 μm is designed between the leadframe and the base plate, the potting compound being an inorganic compound, in particular cement.

A particularly preferable design of the invention consists in that the potting compound generally exhibits a thermal coefficient of expansion of 5 to 10 ppm/K.

BRIEF DESCRIPTION OF THE DRAWINGS

Using exemplary embodiments of the invention that are of particularly preferable design, that are illustrated in the drawings, the invention is explained in more detail. In the drawings.

DETAILED DESCRIPTION

Figure 1:
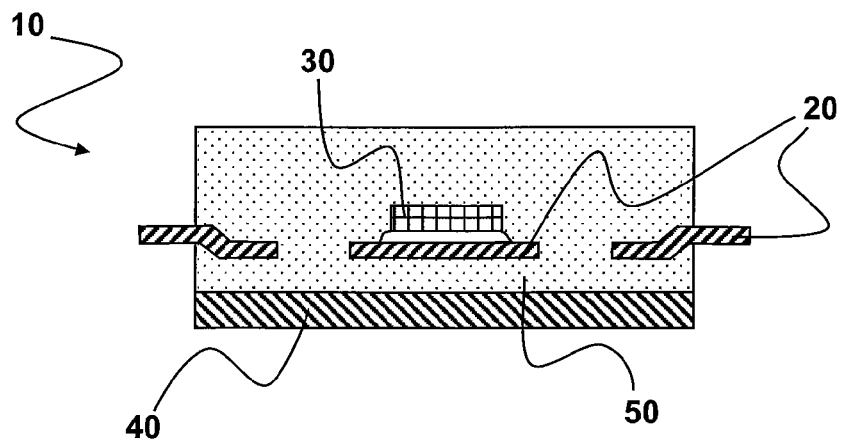
FIG. 1 shows a schematic sectional view of a power module according to the invention.

FIG. 1 shows a schematic cross section through a power module according to the invention of particularly preferable design. The power module 10 exhibits a leadframe 20 and a power semiconductor 30 arranged on the leadframe 20. It is obvious that also a plurality of power semiconductors and other electronic components can be arranged on the leadframe 20.

The leadframe 20 and the power semiconductor 30 are surrounded by a preferable inorganic potting compound 50. The potting compound 50 exhibits a function of mechanically protecting and electrically insulating the power semiconductor 30 arranged on the leadframe 20. Over and above this, the potting compound 50 effects a physical connection between the leadframe 20 and the base plate 40, so that the potting of the leadframe 20 and the power semiconductor 30 and physically connecting the base plate 40 to the potting compound 50 can be accomplished in one process step.

The connection of the power semiconductor 30 to the leadframe 20 may be achieved by a number of known techniques. These may include soldering, brazing or sintering. The potting compound 50 acts not only as a means of encapsulation (thus sealing the semiconductor from the outside environment), but also as an adhesive (fixing in a permanent manner the structure comprising the power semiconductor 30 and leadframe 20 to the base plate 40).

Figure 2:
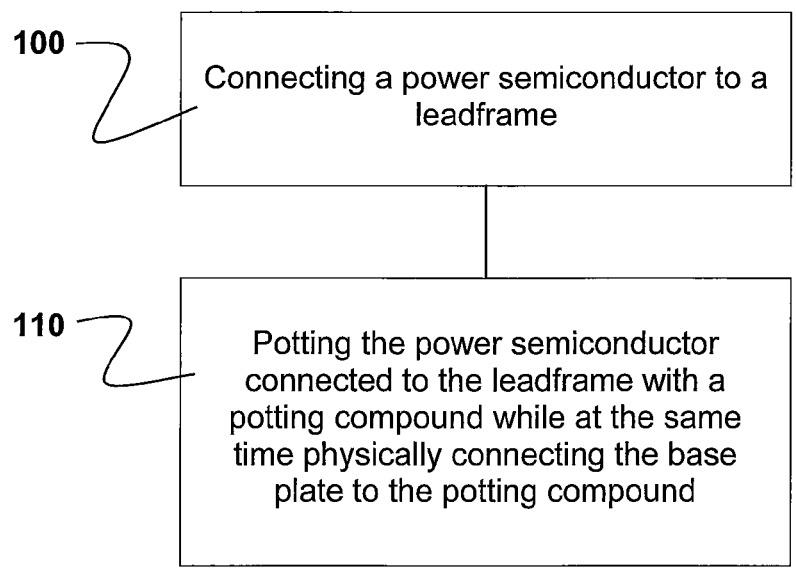
FIG. 2 shows a flow chart for illustrating the sequence of the inventive method.

For this purpose—as FIG. 2 shows in a flow chart of the process steps required for this purpose—in a first step 100 at first the leadframe 20 is connected to the power semiconductor 30. In a second step 110, the power semiconductor 30 connected to the leadframe 20 is surrounded with the potting compound 50 while simultaneously physically connecting a base plate 40 to the potting compound 50.

It can, for example, be envisaged here that the base plate 40 is inserted into a mould and the mould is filled with the potting compound 50. The leadframe 20 supporting the power semiconductor 30 is then lowered into the liquid potting compound 50 while maintaining a predetermined distance from the base plate. After (completely) curing the potting compound 50, the finished power module 10 can be removed from the mould.

As an alternative, the base plate 40 can be inserted into a mould, the leadframe 20 supporting the power semiconductor 30 then being arranged above the base plate 40 while maintaining a predetermined distance and being immobilised in this position. A flowable potting compound 50 is only then transferred into the mould and flows around the leadframe 20 supporting the power semiconductor 30. After (complete) curing of the potting compound 50, the leadframe 20 supporting the power semiconductor 30 is then completely surrounded by the potting compound 50, the base plate 40 is also physically connected to the potting compound 50.

Finally it can also be envisioned to envelope the leadframe 20 supporting the power semiconductor 30 completely with the potting compound 50 for example by immersion and to bring it into contact with a base plate 40 prior to (complete) curing. To this end, for example a leadframe 20 immersed into the potting compound 50 could be lowered on a base plate 40 for the purpose of curing the potting compound 50. During curing of the potting compound 50, the potting compound 50 will connect itself—like an adhesive—to the base plate 40 so that the potting compound 50 physically connects the power semiconductor 30 and/or the leadframe 20 to the base plate 40.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for manufacturing a power module having a leadframe, a power semiconductor, and a base plate, the method comprising the following steps:

connecting the power semiconductor to the leadframe, and potting the power semiconductor connected to the leadframe with a potting compound while at the same time physically connecting the base plate to the potting compound, wherein the potting compound is an inorganic cement, and wherein the potting compound forms a layer arranged between the leadframe and the base plate to electrically insulate the power semiconductor from the base plate.

2. The method according to claim 1, wherein the layer of potting compound arranged between the leadframe and the base plate has a layer thickness of 20 to 200 μm.

3. The method according to claim 1, wherein the potting compound exhibits a thermal coefficient of expansion of 5 to 10 ppm/K.

4. The method according to claim 1, wherein the base plate is designed as a heatsink.

5. The method according to claim 1, wherein the potting compound exhibits a layer arranged between the leadframe and the base plate.

6. The method according to claim 1, wherein the layer of the potting compound arranged between the leadframe and the base plate is between the power semiconductor and the base plate.

7. The method according to claim 1, wherein the inorganic cement is an inorganic solid that results from the mixing of one or more powders with one or more liquids.

8. The method according to claim 7, wherein the mixing of the one or more powders with the one or more liquids results in an acid and base reaction that forms a metal salt that acts as a binding matrix.

9. The method according to claim 3, wherein the layer of potting compound arranged between the leadframe and base plate has a layer thickness of 20 to 200 μm.

10. The method according to claim 4, wherein the layer of potting compound arranged between the leadframe and the base plate has a layer thickness of 20 to 200 μm.

11. The method according to claim 5, wherein the layer of potting compound arranged between the leadframe and the base plate has a layer thickness of 20 to 200 μm.

12. The method according to claim 6, wherein the layer of potting compound arranged between the leadframe and the base plate has a layer thickness of 20 to 200 μm.

13. The method according to claim 7, wherein the layer of potting compound arranged between the leadframe and the base plate has a layer thickness of 20 to 200 μm.

14. The method according to claim 8, wherein the layer of potting compound arranged between the leadframe and the base plate has a layer thickness of 20 to 200 μm.

15. The method according to claim 2, wherein the potting compound exhibits a thermal coefficient of expansion of 5 to 10 ppm/K.

16. The method according to claim 4, wherein the potting compound exhibits a thermal coefficient of expansion of 5 to 10 ppm/K.

17. The method according to claim 5, wherein the potting compound exhibits a thermal coefficient of expansion of 5 to 10 ppm/K.

18. The method according to claim 6, wherein the potting compound exhibits a thermal coefficient of expansion of 5 to 10 ppm/K.

19. The method according to claim 7, wherein the potting compound exhibits a thermal coefficient of expansion of 5 to 10 ppm/K.

20. The method according to claim 8, wherein the potting compound exhibits a thermal coefficient of expansion of 5 to 10 ppm/K.

* * * * *